US012628666B2

(12) United States Patent     (10) Patent No.:   US 12,628,666 B2

Yamaguchi     (45) Date of Patent:     May 12, 2026

(54) SEMICONDUCTOR DEVICE WITH METAL CONNECTOR HAVING NOTCH

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kakeru Yamaguchi, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 316 days.

(21) Appl. No.: 18/351,542

(22) Filed: Jul. 13, 2023

(65) Prior Publication Data

US 2024/0038715 A1     Feb. 1, 2024

(30) Foreign Application Priority Data

Jul. 29, 2022    (JP) .............................. JP2022-121828

(51) Int. Cl.
     *H01L 23/00*      (2006.01)
     *H01L 23/495*      (2006.01)

(52) U.S. Cl.
     CPC ........ *H01L 24/37* (2013.01); *H01L 23/49562* (2013.01); *H01L 24/40* (2013.01);
     (Continued)

(58) Field of Classification Search
     CPC .... H01L 24/37; H01L 24/40; H01L 23/49555
     (Continued)

(56) References Cited

U.S. PATENT DOCUMENTS 7,719,100 B2    5/2010   Yamashita et al.
8,299,600 B2   10/2012   Sato et al.
           (Continued)

FOREIGN PATENT DOCUMENTS

JP     2007-95984 A    4/2007
JP     2010-123686 A    6/2010
           (Continued)

OTHER PUBLICATIONS

Decision to Grant a Patent, issued Feb. 3, 2026 in Japanese Patent Application No. 2022-121828, with English translation.

*Primary Examiner* — Quoc D Hoang
(74) *Attorney, Agent, or Firm* — Oblon, McClelland, Maier & Neustadt, L.L.P.

(57)         ABSTRACT

A semiconductor device according to an embodiment includes a metal frame separated from a semiconductor chip, and a metal connector connected to the semiconductor chip via a first bonding material on an electrode of the semiconductor chip, and connected to the metal frame via a second bonding material on a disposition surface of the metal frame. The metal connector includes: a first part connected to the first bonding material and serving as a first end; a second part connected to the first part and rising toward the metal frame; a third part connected to the second part and serving as a second end; and a notch that opens on a second-end-side surface formed on the third part, adjacent to a connecting surface connected to the second bonding material, and opposed to a tilted surface of the metal frame adjacent to and tilted with respect to the disposition surface.

5 Claims, 5 Drawing Sheets

(52) U.S. Cl.
CPC ............... *H01L 2224/37005* (2013.01); *H01L 2224/40175* (2013.01)

(58) Field of Classification Search
USPC ......................................................... 257/666
See application file for complete search history.

(56) References Cited

U.S. PATENT DOCUMENTS

| | | | | |
|---|---|---|---|---|
| 2020/0211937 A1* | 7/2020 | Saito | ................. | H01L 23/49524 |
| 2021/0159162 A1 | 5/2021 | Ise et al. | | |

FOREIGN PATENT DOCUMENTS

| | | |
|---|---|---|
| JP | 2012-104708 | 5/2012 |
| JP | 2013-197365 | 9/2013 |
| JP | 2015-80383 A | 4/2015 |
| JP | 2019-087741 | 6/2019 |
| JP | 2020-088319 | 6/2020 |
| JP | 2023-008226 | 1/2023 |

* cited by examiner

SEMICONDUCTOR DEVICE WITH METAL CONNECTOR HAVING NOTCH

CROSS-REFERENCE TO RELATED APPLICATIONS

This application is based upon and claims the benefit of priority from Japanese Patent Application No. 2022-121828, filed on Jul. 29, 2022; the entire contents of which are incorporated herein by reference.

FIELD

Embodiments described herein relate generally to a semiconductor device.

BACKGROUND

Conventionally, for a semiconductor package manufactured by bonding a Si semiconductor chip or the like with a lead frame formed of copper or the like and various connectors including a gate connector by using a bonding material such as solder and then carrying out mold-sealing with resin, a reflow furnace which heats and bonds the solder in a bonding process is used.

DETAILED DESCRIPTION

According to an embodiment, A semiconductor device includes a semiconductor chip, a first bonding material, a metal frame, a second bonding material, and a metal connector. The semiconductor chip has an electrode. The first bonding material is provided on the electrode of the semiconductor chip. The metal frame is disposed to be separated from the semiconductor chip. The second bonding material is provided on the metal frame. The metal connector is connected to the semiconductor chip via the first bonding material and connected to the metal frame via the second bonding material. The metal frame includes a disposition surface and a tilted surface. The second bonding material is disposed on the disposition surface. The tilted surface is adjacent to the disposition surface and tilted by a predetermined angle with respect to the disposition surface. The metal connector includes a first part, a second part, a third part, a connecting surface, a second-end-side surface, and a notch. The first part is connected to the first bonding material and serves as a first end. The second part is integrally connected to the first part and formed so as to rise toward the metal frame. The third part is integrally connected to the second part and serves as a second end. The connecting surface is formed in the third part and connected to the second bonding material. The second-end-side surface is formed on the third part, adjacent to the connecting surface, and opposed to the tilted surface of the metal frame. The notch opens on the second-end-side surface and penetrates through the third part in a thickness direction.

Figure 1:
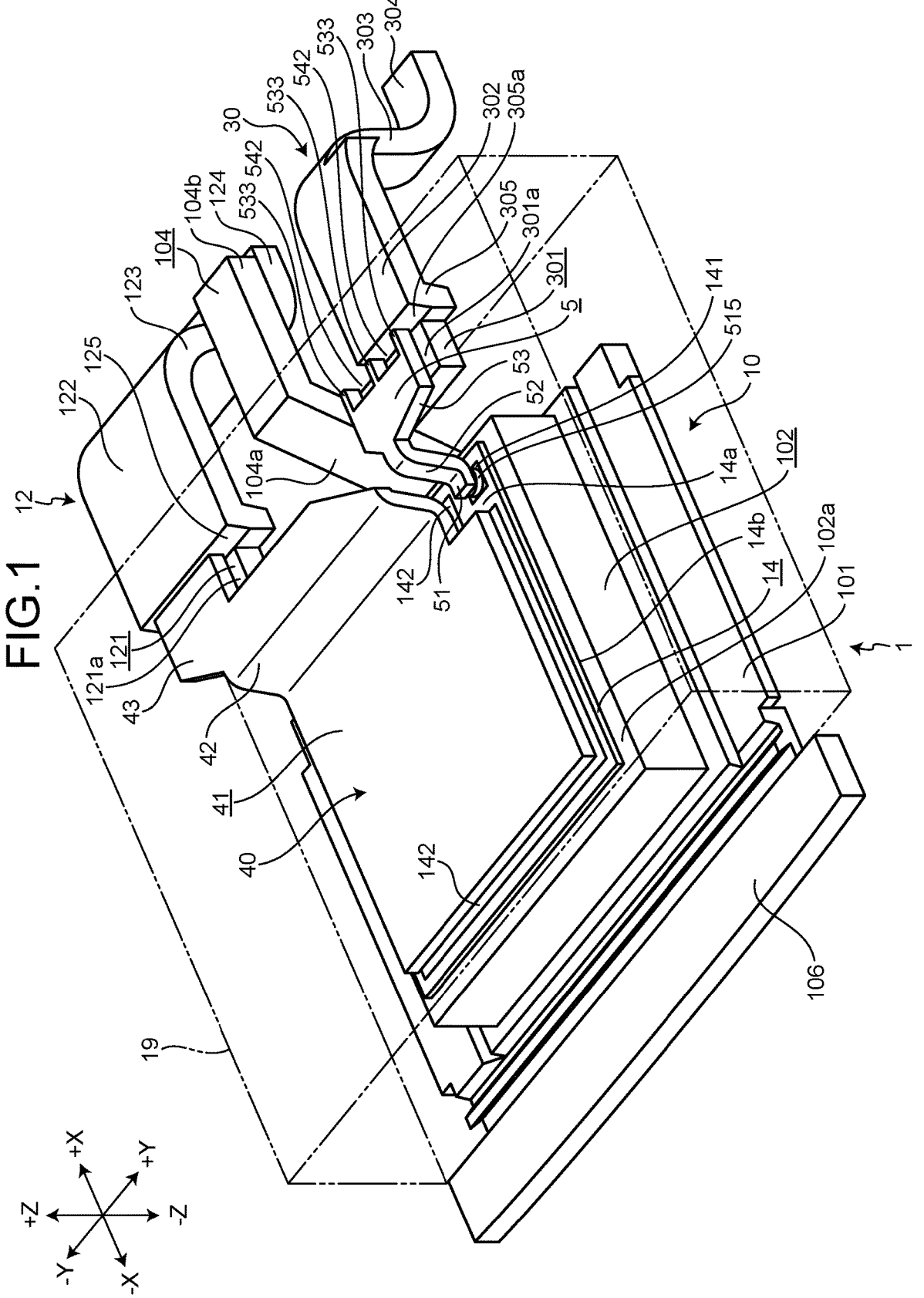
FIG. 1 is a perspective view illustrating a semiconductor device of the present embodiment.
Figure 2:
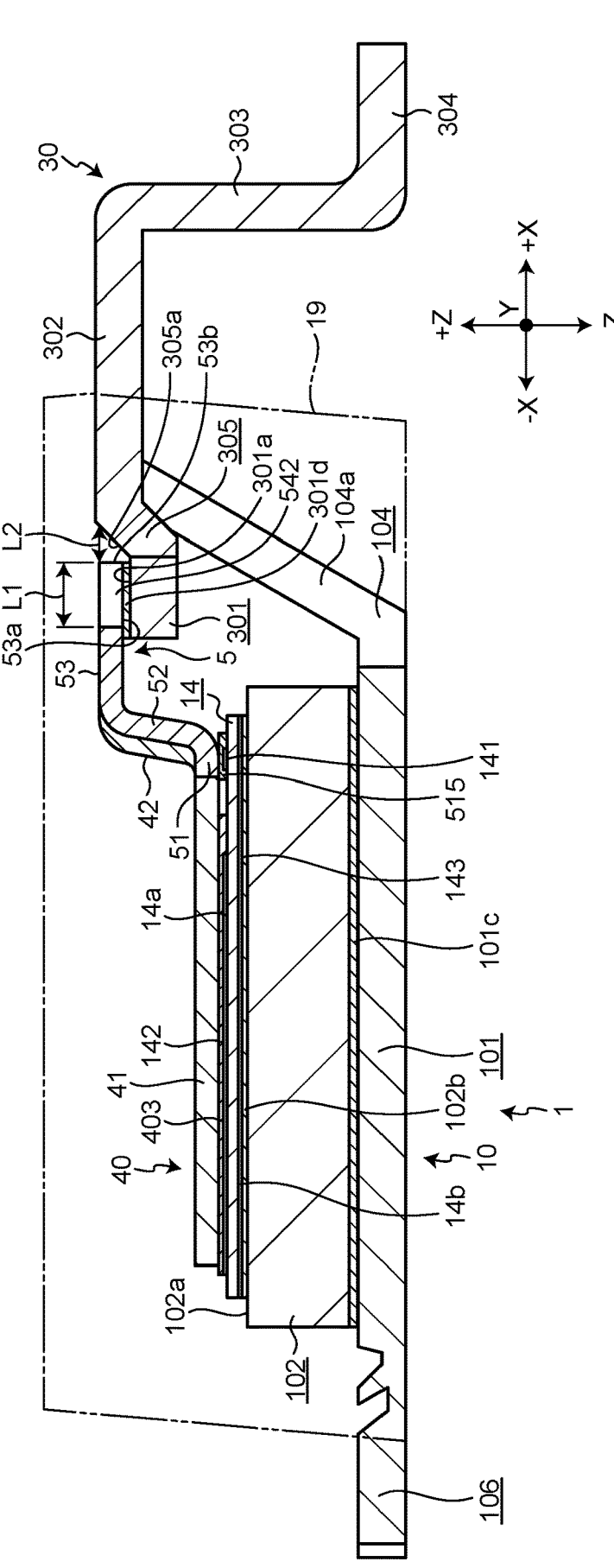
FIG. 2 is a cross-sectional view illustrating the semiconductor device of the present embodiment.
Figure 3:
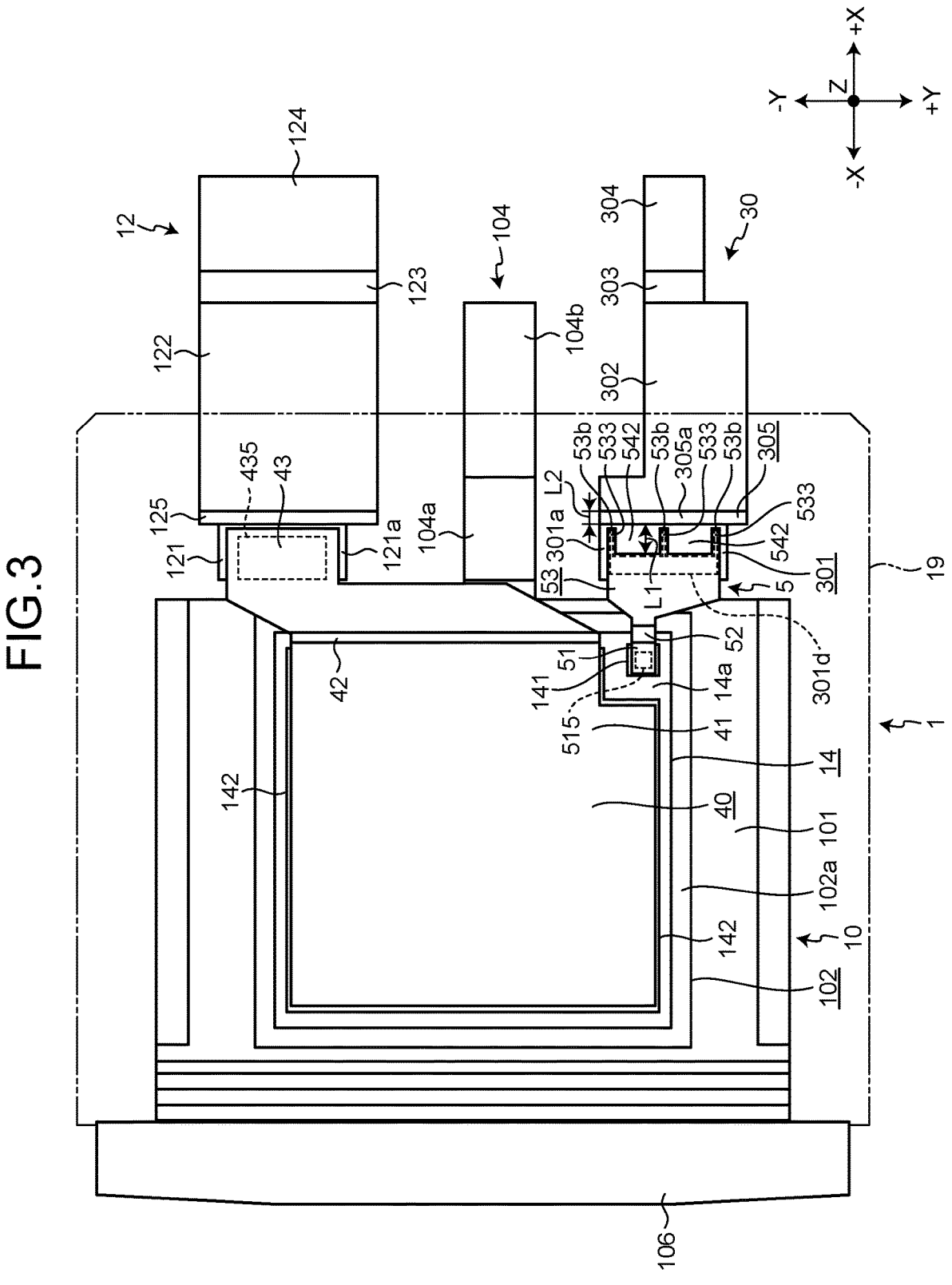
FIG. 3 is a plan view illustrating the semiconductor device of the present embodiment.

An outline of a semiconductor device 1 of the present embodiment will be described with reference to FIG. 1 to FIG. 3. The semiconductor device 1 is provided with: a first lead frame 10, a second lead frame 12, a metal frame 30 which is a third lead frame, a source connector 40 which is a first electrically-conductive member, a metal connector 5 which is a second electrically-conductive member, a semiconductor chip 14 provided with a plurality of electrodes, and a sealing material 19 which protects the semiconductor chip 14. In FIG. 1 to FIG. 3, in order to facilitate understanding of the internal structure of the semiconductor device 1, the sealing material 19 is illustrated by a dashed-two-dotted line.

Hereinafter, parts of the semiconductor device 1 will be described in detail. In the following description, an X-axis/Y-axis/Z-axis orthogonal coordinate system is used. An X-axis direction includes a +X direction and a −X direction. A Y-axis direction includes a +Y direction and a −Y direction. A Z-axis direction includes a +Z direction and a −Z direction. As illustrated in FIG. 1 to FIG. 3, the direction from a main-body portion 101 of the first lead frame 10 toward the semiconductor chip 14 is assumed to be an upward direction (+Z direction). The opposite direction of the upward direction is assumed to be a downward direction (−Z direction). The direction from the metal connector 5 toward the metal frame 30 in the X-axis/Y-axis plane (horizontal plane) is assumed to be the +X direction, and the opposite direction of the +X direction is assumed to be the −X direction. The direction from the second lead frame 12 toward the metal frame 30 is assumed to be the +Y direction, and the opposite direction of the +Y direction is assumed to be the −Y direction.

The semiconductor chip 14, which is illustrated in FIG. 1 to FIG. 3 and has a rectangular plate shape in a planar view, is a Metal-Oxide-Semiconductor Field Effect Transistor (MOSFET) using silicon as a base material in the present embodiment, but is not limited thereto. More specifically, the semiconductor chip 14 may be, for example, a vertical Insulated Gate Bipolar Transistor (IGBT), a vertical diode, or another semiconductor chip. Also, the semiconductor chip 14 may use a compound different from silicon such as SiC or GaN as a base material. The semiconductor chip 14 is disposed on the main-body portion 101 of the first lead frame 10, for example, with a copper block 102 interposed therebetween.

The first lead frame 10 is formed of an electrically-conductive material such as copper and is provided with, for example, the main-body portion 101 which is a die pad, the copper block 102 disposed on the main-body portion 101, and a projecting portion 104 projecting from the main-body portion 101 in the +X direction in the planar view. The copper block 102 plays the role to adjust the overall thickness of the first lead frame 10 in the Z-axis direction. Therefore, the first lead frame 10 is not required to be provided with the copper block 102.

The shape of the main-body portion 101 is a plate shape, and, for example, the lengths of the copper block 102 in the X-axis direction and the Y-axis direction are set to be shorter than the lengths of the main-body portion 101 in the X-axis direction and the Y-axis direction. The thickness of the copper block 102 in the Z-axis direction is set to be thicker than the thickness of the main-body portion 101. For example, an upper surface and a lower surface of the main-body portion 101 are parallel to the horizontal plane (X-axis/Y-axis plane). As illustrated in FIG. 2, the copper block 102 is connected to the upper surface of the main-body portion 101 with a bonding member 101*c* such as solder.

As illustrated in FIG. 1 to FIG. 3, the projecting portion 104 is projecting from the main-body portion 101 in the +X direction and is positioned between the second lead frame 12 and the metal frame 30 in the Y-axis direction. The projecting portion 104 has, for example, a first extending portion 104*a* and a second extending portion 104*b*.

As illustrated in FIG. 2, the first extending portion 104*a* is connected to the main-body portion 101. As illustrated in FIG. 1, the first extending portion 104*a* is extending along a direction which is tilted with respect to the Z-axis direction and the X-axis direction so as to advance in the upward direction as the portion advances in the +X direction. The second extending portion 104*b* is connected to the first extending portion 104*a* and is extending from the first extending portion 104*a* along the +X direction. For example, an upper surface of the second extending portion 104*b* is parallel to the horizontal plane. The first lead frame 10 is not required to be provided with the projecting portion 104.

The first lead frame 10 is provided with, for example, a second projecting portion 106 which is extending from the main-body portion 101 in the −X direction. For example, the second projecting portion 106 is set to have a width, which is wider than the main-body portion 101 in the Y-axis direction, and is extending approximately parallel to the horizontal plane from an end of the main-body portion 101 in the −X direction. The first lead frame 10 is not required to be provided with the second projecting portion 106.

As illustrated in FIG. 2, an electrically-conductive bonding member 102*b* such as solder is provided between a lower surface 14*b* of the semiconductor chip 14 and an upper surface 102*a* of the copper block 102, and the semiconductor chip 14 and the copper block 102 are bonded to each other by the bonding member 102*b*. The semiconductor chip 14 is provided with, for example, a first electrode 141, a second electrode 142, and a third electrode 143 as a plurality of electrodes.

The first electrode 141 illustrated in FIG. 1 and FIG. 2 are provided on an upper surface 14*a* of the semiconductor chip 14. The first electrode 141 corresponds to a gate electrode in the present embodiment. The second electrode 142 illustrated in FIG. 1 and FIG. 2, for example, has a larger area than the first electrode 141 and is provided on the upper surface 14*a* of the semiconductor chip 14. The second electrode 142 corresponds to a source electrode in the present embodiment. As illustrated in FIG. 1, the first electrode 141 and the second electrode 142 are disposed to be separated from each other in the X-axis/Y-axis plane so as not to contact each other.

As illustrated in FIG. 2, the third electrode 143 is provided on the lower surface 14*b* of the semiconductor chip 14. The third electrode 143 is expanded in approximately the entire area of the lower surface 14*b*. The third electrode 143 corresponds to a drain electrode in the present embodiment. The third electrode 143 is electrically connected to the first lead frame 10 via the bonding member 102*b*.

The second lead frame 12 is formed of an electrically-conductive material such as copper. As illustrated in FIG. 1 and FIG. 3, the second lead frame 12 is separated from the first lead frame 10 in the X-axis direction. In the present embodiment, the second lead frame 12 has a flat plate portion 121, a tilted portion 125, a first extending portion 122, a second extending portion 123, and a third extending portion 124.

As illustrated in FIG. 1, the flat plate portion 121 is positioned, for example, above the upper surface 14*a* of the semiconductor chip 14. As illustrated in FIG. 3, the flat plate portion 121 is separated from the main-body portion 101 in the +X direction in the planar view. An upper surface 121*a* of the flat plate portion 121 is, for example, parallel to the X-axis/Y-axis plane (horizontal plane).

The first extending portion 122 is connected to the flat plate portion 121 via the tilted portion 125 and is extending along the +X direction. The first extending portion 122 is positioned above the flat plate portion 121. Therefore, the tilted portion 125 is extending obliquely upward toward the +X direction side. The second extending portion 123 is connected to the first extending portion 122. The second extending portion 123 is extending along a direction which is tilted with respect to the X-axis direction and the Z-axis direction so as to advance in the downward direction as the portion advances in the +X direction. The third extending portion 124 is connected to the second extending portion 123 and is extending along the +X direction.

The metal frame 30 is formed of an electrically-conductive material such as copper. As illustrated in FIG. 1 to FIG. 3, the metal frame 30 is separated from the first lead frame 10 and the semiconductor chip 14. The second lead frame 12 and the metal frame 30 are disposed to be separated from each other in the Y-axis direction. In the present embodiment, the metal frame 30 has a flat plate portion 301, a tilted portion 305, a first extending portion 302, a second extending portion 303, and a third extending portion 304. The flat plate portion 301, the tilted portion 305, and the first extending portion 302 of the metal frame 30 are positioned above outside (in the +X direction side) the outer periphery of the semiconductor chip 14.

As illustrated in FIG. 1 and FIG. 2, the flat plate portion 301 is positioned above the upper surface 14*a* of the semiconductor chip 14. In the planar view, the flat plate portion 301 is separated from the main-body portion 101 in the +X direction. For example, an upper surface of the flat plate portion 301 is parallel to the horizontal plane. As illustrated in FIG. 2 and FIG. 3, an upper surface of the flat plate portion 301 is a disposition surface 301*a* on which a second bonding material 301*d* is disposed. For example, in the Z-axis direction, the disposition surface 301*a* is positioned at approximately the same height as the upper surface 121*a* of the flat plate portion 121 of the second lead frame 12.

As illustrated in FIG. 1 and FIG. 2, the tilted portion 305 is connected to the flat plate portion 301 and is extending obliquely upward toward the +X direction side from the flat plate portion 301. An upper surface of the tilted portion 305 is a tilted surface 305*a*, which is adjacent to the disposition surface 301*a* and is tilted by a predetermined angle with respect to the disposition surface 301*a*.

As illustrated in FIG. 2, for example, the tilted portion 305 is tilted by an angle of 45 degrees from the disposition surface 301*a*, which is parallel to the horizontal plane (X-axis/Y-axis plane), but the tilt angle is not limited to that of the present example. The tilted surface 305*a* of the tilted portion 305 is opposed to a second end side (+X direction side) of the metal connector in the X-axis direction.

The first extending portion 302 is connected to the tilted portion 305 and is extending in parallel to the +X direction. The second extending portion 303 is connected to the first extending portion 302. The second extending portion 303 is extending to be tilted with respect to the X-axis direction and the Z-axis direction so as to advance in the downward direction as the portion advances in the +X direction. The third extending portion 304 is connected to the second extending portion 303 and is extending along the +X direction.

The source connector 40 illustrated in FIG. 1 electrically connects the second electrode 142, which is the source electrode of the semiconductor chip 14, and the second lead frame 12. The source connector 40 is formed of an electrically-conductive material such as copper. The source connector 40 has a plate-shaped first part 41, a second part 42 rising from the first part 41 toward the +Z direction, and a plate-shaped third part 43. In the illustrated example, the source connector 40 is formed to be larger than the metal connector 5, which is a gate connector.

For example, the first part 41, which is formed in an approximately rectangular plate shape in the planar view, is disposed on the second electrode 142. As illustrated in FIG. 2, an electrically-conductive bonding member 403 such as solder is disposed between a lower surface of the first part 41 and the second electrode 142, and the first part 41 and the second electrode 142 are bonded to each other by the bonding member 403.

The second part 42 is rising in the +Z direction from an end of the first part 41 in the +X direction by a predetermined length and then extending toward the +X direction. The third part 43, which is integrally connected to the second part 42, is formed to have a shorter length (width) in the Y-axis direction compared with the first part 41 and the second part 42. The third part 43 is provided on the flat plate portion 121 of the second lead frame 12. As illustrated in FIG. 2, an electrically-conductive bonding member 435 such as solder is disposed between a lower surface of the third part 43 and the upper surface 121a of the flat plate portion 121, and the third part 43 and the flat plate portion 121 are bonded to each other by the bonding member 435.

As illustrated in FIG. 1 to FIG. 3, the metal connector 5 electrically connects the first electrode 141 and the metal frame 30 of the semiconductor chip 14. The metal connector 5 is formed of an electrically-conductive material such as copper. The metal connector 5, which is the second electrically-conductive member, and the source connector 40, which is the first electrically-conductive member, are separated from each other in the horizontal direction.

In the present embodiment, the −X direction side of the metal connector 5 is assumed to be a first end, and the +X direction side thereof is assumed to be a second end, which is in the opposite side of the first end. The metal connector 5 has, for example, a first part 51 serving as the first end connected to the semiconductor chip 14, a second part 52 integrally connected to the first part 51 and extending so as to rise toward the metal frame 30, and a third part 53 serving as the second end connected to the metal frame 30.

The first part 51 is disposed on the first electrode 141. A first bonding material 515 such as solder is disposed between the first part 51 and the first electrode 141, and the first part 51 and the first electrode 141 are bonded to each other by the first bonding material 515. The first part 51 is formed, for example, in a rectangular shape in the planar view.

The second part 52 is integrally connected to the first part 51 and is extending so as to be tilted with respect to the Z-axis direction and the X-axis direction so as to advance in the upward direction as the portion advances in the +X direction. For example, the direction (Y-axis direction) orthogonal to the direction (X-axis direction), in which the tilted surface 305a of the metal frame 30 and a second-end-side surface 53b of the metal connector 5 are opposed to each other, and the thickness direction (Z-axis direction) of the third part 53 is assumed to be the width direction of the metal connector 5. In the present embodiment, the first part 51 and the second part 52 are set to have approximately the same length (width) in the Y-axis direction (width direction).

As illustrated in FIG. 1 and FIG. 2, the third part 53 positioned above the first part 51 is provided on the flat plate portion 301 of the metal frame 30. A lower surface of the third part 53 illustrated in FIG. 2 serves as a connecting surface 53a. The second bonding material 301d such as solder is disposed between the connecting surface 53a and the disposition surface 301a of the flat plate portion 301, and the third part 53 and the flat plate portion 301 are bonded to each other by the second bonding material 301d.

The shape of the third part 53 of the metal connector 5 is a plate shape. The third part 53, for example, has a shape in which a trapezoidal plate extending in the +X direction while gradually increasing the width thereof in the Y-axis direction (width direction) from the second part 52 and an approximately rectangular plate having a constant width in the Y-axis direction are integrated flush. The width of the third part 53 in the Y-axis direction is set to be, for example, several times larger than the width of the first part 51 and the second part 52 in the Y-axis direction. In the present embodiment, the weight of the third part 53 is larger than the weight of the first part 51.

In the example illustrated in FIG. 1 and FIG. 3, the connecting location of the second part 52 with respect to the third part 53 is shifted toward the −Y direction from the middle position of the third part 53 in the Y-axis direction, but the connecting location may match the middle position of the third part 53 in the Y-axis direction.

The lateral surface of the third part 53 in the +X direction illustrated in FIG. 2 and FIG. 3 is assumed to be the second-end-side surface 53b. The second-end-side surface 53b adjacent to the connecting surface 53a illustrated in FIG. 2 is opposed to, in the X-axis direction, the tilted surface 305a of the tilted portion 305 of the metal frame 30 with a predetermined gap interposed therebetween.

The metal connector 5 of the semiconductor device 1 of the present embodiment is provided with notches 542, which are formed from the second-end-side surface 53b of the third part 53 so as to open toward the first part 51 and penetrate through the metal connector 5 in the thickness direction (Z-axis direction) thereof.

As illustrated in FIG. 1 and FIG. 2, the notches 542 are, for example, rectangular when the metal connector 5 is viewed in the planar view, and the two notches are formed to be arranged in the Y-axis direction in an area of the third part 53 in the +X direction side. The two notches 542 cause the third part 53 to be provided with three projecting portions 533.

The second-end-side surfaces 53b in the +X direction side of the projecting portions 533 illustrated in FIG. 1 are, for example, at the same position in the X-axis direction. The positions of the second-end-side surfaces 53b of the three projecting portions 533 in the X-axis direction may be mutually different. For example, the widths of the two notches 542 in the Y-axis direction are the same, and the intervals of the three projecting portions 533, which are formed by the two notches 542, in the Y-axis direction are, for example, equal intervals. The widths of the two notches 542 may be different from each other. The number of the notches 542 formed for the third part 53 is not limited to two, but may be one or may be three or more. The lengths L1 of the two notches 542 of the third part 53 in the X-axis direction are the same in the example illustrated in FIG. 2 and FIG. 3, but the lengths of the two notches 542 in the X-axis direction may be different from each other.

In the semiconductor device 1 of the present embodiment, for example, in the direction (X-axis direction) in which the tilted surface 305a of the metal frame 30 and the second-end-side surface 53b of the metal connector 5 are opposed to each other, the length L1 of the two notches 542 of the metal connector 5 is set to be longer than the distance L2 (maximum distance L2) between the tilted surface 305a of the metal frame 30 and the second-end-side surface 53b of the metal connector 5.

Figure 4:
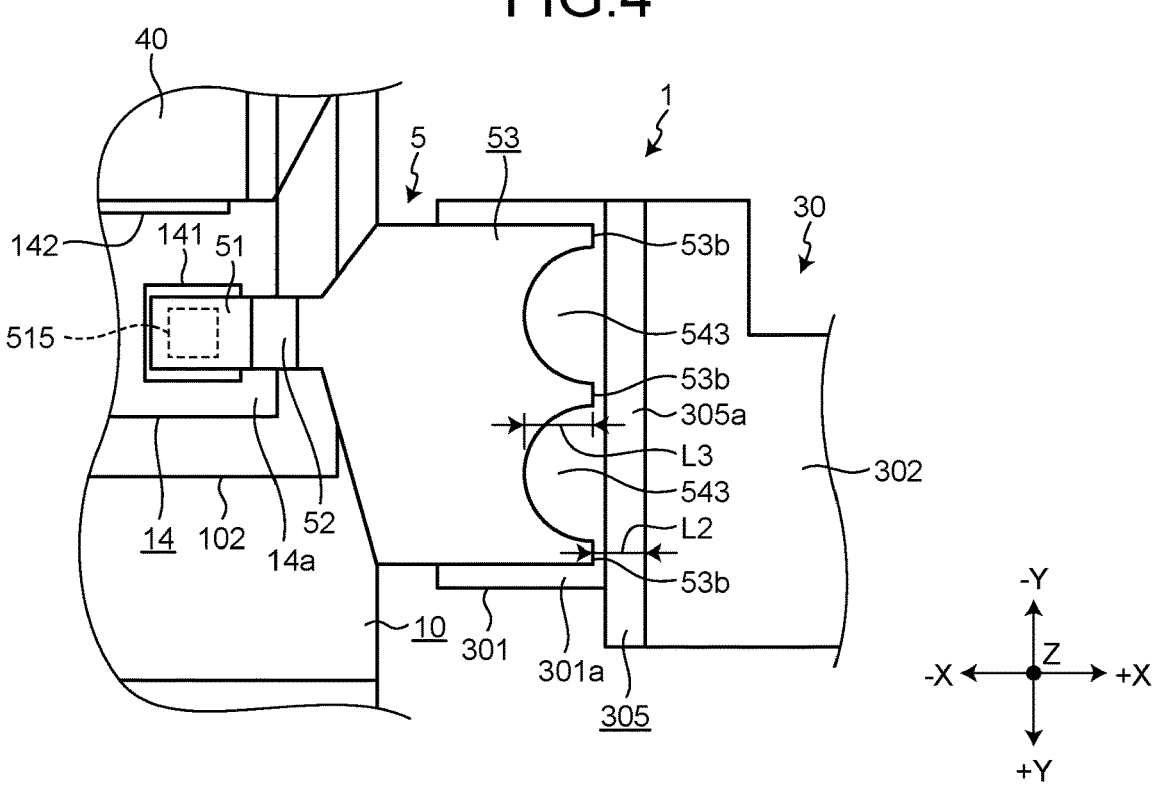
FIG. 4 is a plan view describing semicircular notches formed in a third part of a metal connector.

The notches formed in the third part 53 are not limited to the rectangular notches 542 illustrated in FIG. 1 and FIG. 3. As illustrated in FIG. 4, for example, two semicircular notches 543 may be formed in the third part 53 instead of the rectangular notches 542. For example, the semicircular notches 543 are formed in the third part 53 so that the centers of the circles of the semicircular notches 543 are at the same positions as the positions of the second-end-side surfaces 53b of the third part 53 in the X-axis direction. The number of the notches 543 formed may be one or three or more, or the notches 543 may be semi-elliptical notches instead of semicircular ones. In such a case, the long axis of the semi-elliptical notch may be parallel to the X-axis direction, or the short axis thereof may be parallel to the X-axis direction.

For example, in the X-axis direction, the length L3 of the two semicircular notches 543 of the metal connector 5 is the radius of the notch 543. The length L3 of the two notches 543 is, for example, set to be longer than the maximum distance L2 between the tilted surface 305a of the metal frame 30 and the second-end-side surface 53b of the metal connector 5.

Figure 5:
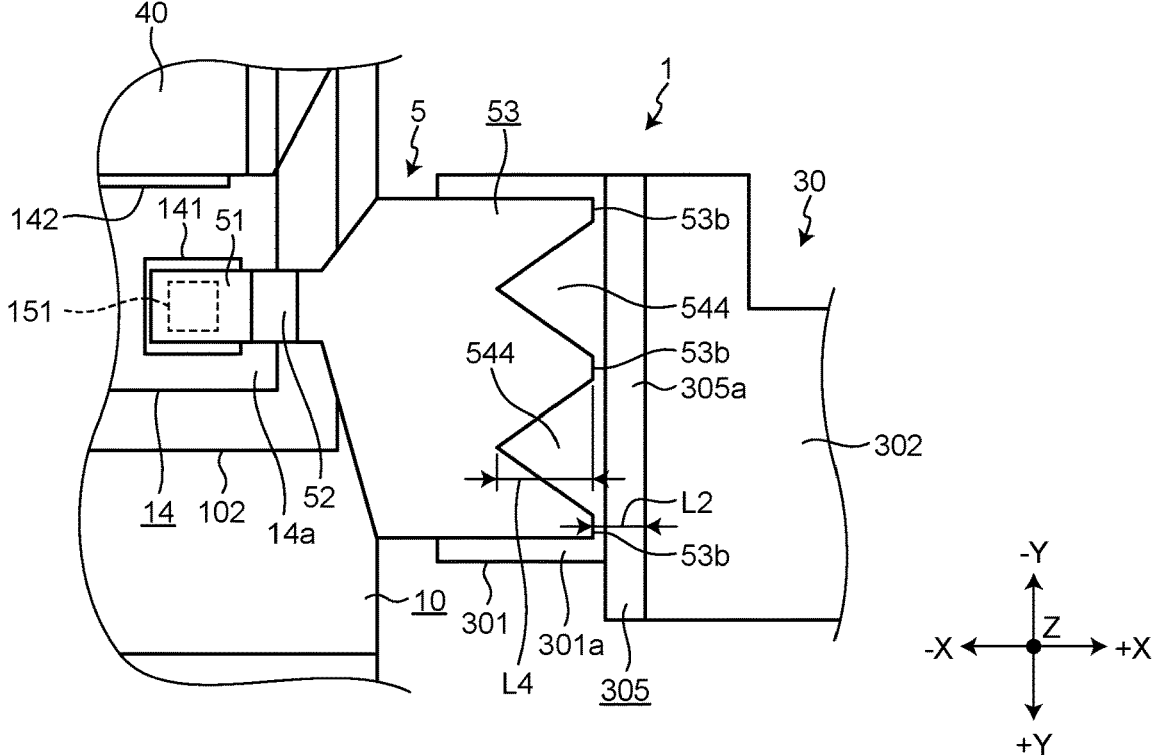
FIG. 5 is a plan view describing V-shaped notches formed in the third part of the metal connector.

For example, as illustrated in FIG. 5, instead of the rectangular notches 542 illustrated in FIG. 1, two V-shaped notches 544 may be formed in the third part 53 of the metal connector 5. The number of the notches 544 formed may be one or three or more. For example, the length L4 of the two notches 544 of the metal connector 5 in the X-axis direction illustrated in FIG. 5, in other words, the length L4 from the second-end-side surface 53b to a V-shape tip of the notch 544 is, for example, set to be longer than the maximum distance L2 between the tilted surface 305a of the metal frame 30 and the second-end-side surface 53b of the metal connector 5.

As illustrated in FIG. 1 to FIG. 3, the sealing material 19 is formed to be approximately cuboidal in the present embodiment. However, the shape of the sealing material 19 is not limited to that of the present example. The sealing material 19 seals a bonding portion between the first lead frame 10 and the semiconductor chip 14, a bonding portion between the first electrode 141 and the metal connector 5, a bonding portion between the metal connector 5 and the metal frame 30, a bonding portion between the second electrode 142 and the source connector and a bonding portion between the source connector 40 and the second lead frame 12. Specifically, the sealing material 19 covers the upper surface and lateral surfaces of the main-body portion 101 of the first lead frame 10, the upper surface 102a and lateral surfaces of the copper block 102, and the projecting portion 104 from the first extending portion 104a to part of the second extending portion 104b. The sealing material 19 also covers the second lead frame 12 from the flat plate portion 121 to part of the first extending portion 122. The sealing material 19 also covers part of the flat plate portion 301 and the first extending portion 302 of the metal frame 30.

The sealing material 19 exposes part of the first lead frame 10, part of the second lead frame 12, and part of the metal frame 30. Specifically, the sealing material 19 exposes the lower surface of the main-body portion 101 of the first lead frame 10, the other part of the second extending portion 104b of the projecting portion 104, and the second projecting portion 106. The sealing material 19 also exposes the other part of the first extending portion 122, the second extending portion 123, and the third extending portion 124 of the second lead frame 12. The sealing material 19 also exposes the other part of the first extending portion 302, the second extending portion 303, and the third extending portion 304 of the metal frame 30.

When the semiconductor device 1 is in use, the lower surface of the main-body portion 101 of the first lead frame 10, the second projecting portion 106 of the first lead frame 10, the third extending portion 124 of the second lead frame 12, and the third extending portion 304 of the metal frame 30 are electrically connected to external wiring. However, the part of each of the first lead frame 10, the second lead frame 12, and the metal frame 30 exposed from the sealing material 19 is not limited to that of the above described example.

Next, a process of manufacturing the semiconductor device 1 according to the present embodiment will be briefly described. First, the first lead frame 10 illustrated in FIG. 1 to FIG. 3 is prepared. The main-body portion 101 of the first lead frame 10 and the copper block 102 are integrated in advance. First, the semiconductor chip 14 is disposed on the bonding member 102b of the copper block 102. In this process, the semiconductor chip 14 is disposed so that the third electrode 143 is opposed to the bonding member 102b on the copper block 102. Therefore, the second electrode 142 and the first electrode 141 of the semiconductor chip 14 are exposed from the upper surface 14a of the semiconductor chip 14.

Then, the bonding member 403 before reflow is disposed on the second electrode 142 of the semiconductor chip 14. The first bonding material 515 before reflow is disposed on the first electrode 141 of the semiconductor chip 14. The bonding member 435 before reflow is disposed on the upper surface 121a of the flat plate portion 121 of the second lead frame 12. The second bonding material 301d before reflow is disposed on the disposition surface 301a, which is the upper surface of the flat plate portion 301 of the metal frame 30. The order of disposing the above described bonding materials is not particularly limited.

Then, the source connector 40 is disposed on the bonding member 403 and on the bonding member 435. The first part 51 of the metal connector 5, which is a gate connector, is disposed on the first bonding material 515, and the third part 53 of the metal connector 5 is disposed on the second bonding material 301d. As a result, the connecting surface 53a of the third part 53 and the second bonding material 301d become a state in which they are in contact with each other by the surfaces thereof. In the state in which a predetermined gap is formed between the second-end-side surfaces 53b of the third part 53 and the tilted surface 305a of the tilted portion 305 of the metal frame 30, the three second-end-side surfaces 53b and the tilted surface 305a are opposed to each other in the X-axis direction in the present embodiment. For example, the shape of the second bonding material 301d is cut in advance to fit the shapes of the notches 542 of the third part 53. More specifically, when the third part 53 is viewed in the planar view, the second bonding material 301*d* is not exposed from the two notches 542.

Next, an intermediate body including the first lead frame 10, the second lead frame 12, the metal frame 30, the source connector 40, the metal connector 5, the semiconductor chip 14, the previously described first bonding material 515 and the second bonding material 301*d*, etc. is disposed in an unillustrated reflow furnace. Then, the intermediate body is heated to melt the bonding member 102*b*, the first bonding material 515, the second bonding material 301*d*, the bonding member 403, and the bonding member 435 illustrated in FIG. 2.

Then, the bonding member 102*b*, the first bonding material 515, the second bonding material 301*d*, the bonding member 403, and the bonding member 435 are cooled and solidified. As a result, the first lead frame 10 and the semiconductor chip 14 are bonded to each other. The first part 41 of the source connector 40 is bonded to the second electrode 142 of the semiconductor chip 14, and the third part 43 is bonded to the flat plate portion 121 of the second lead frame 12.

Figure 6:
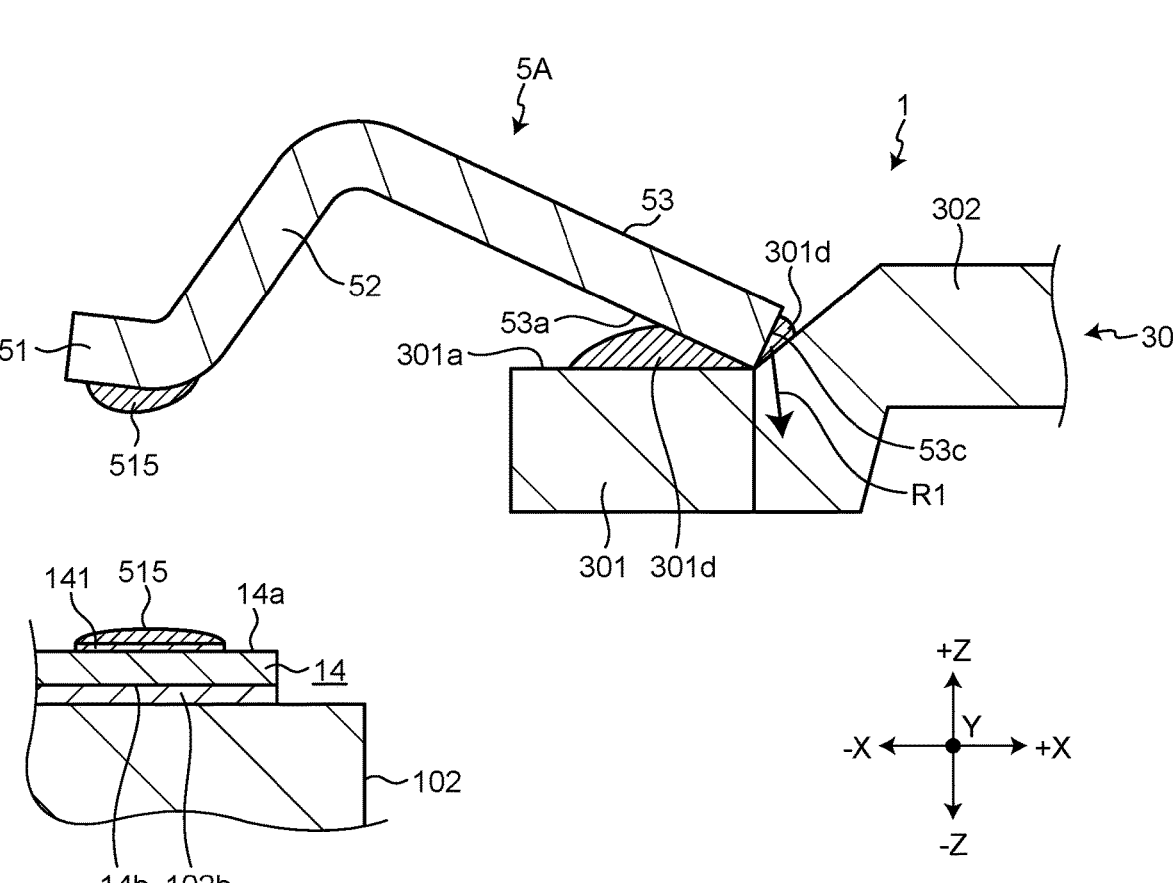
FIG. 6 is a cross-sectional view describing insufficient bonding between a metal connector and a semiconductor chip caused by the Manhattan phenomenon in a case in which the metal connector is not provided with notches.

As an example, a case that the metal connector 5 of the semiconductor device 1 is not provided with the notches 542 illustrated in FIG. 1 to FIG. 3 is assumed. At a metal connector 5A illustrated in FIG. 6 not provided with the notches 542, insufficient bonding due to the Manhattan phenomenon sometimes occurs after the above described cooling and solidification of the first bonding material 515 and the second bonding material 301*d* is carried out. In FIG. 6, the source connector 40 and the projecting portion 104 are omitted, and part of the metal connector 5A, which is not provided with the notches 542 as illustrated in FIG. 1 to FIG. 3, and part of the metal frame 30 is illustrated in an enlarged manner. The second-end-side surface of the third part 53 of the metal connector 5A, which is not provided with the notches 542, in the +X direction side is assumed to be a second-end-side surface 53*c*. More specifically, the second-end-side surface 53*c* of the third part 53 of the metal connector 5 illustrated in FIG. 6 continues from an end to another end in the Y-axis direction without being interrupted.

When the first bonding material 515, which is solder, and the second bonding material 301*d*, which is solder, melt during the reflow process, the second bonding material 301*d* liquidized on the disposition surface 301*a* sometimes flows around the second-end-side surface 53*c* of the third part 53 of the metal connector 5A illustrated in FIG. 6, which is not provided with the notches 542, as illustrated in FIG. 6. As a result, since the gap between the second-end-side surface 53*c*, which continues in the Y-axis direction without being interrupted, and the tilted surface 305*a* of the metal frame 30 is a long and thin gap extending in the Y-axis direction, the second bonding material 301*d*, which has been liquidized and flowed around the second-end-side surface 53*c*, is drawn to the lower side of the long and thin gap. Then, in some cases, surface tension occurs between the second-end-side surface 53*c* and the tilted surface 305*a*, and the metal connector 5A is drawn by the surface tension obliquely downward toward the tilted surface 305*a* side (arrow R1 direction). Then, in some cases, the phenomenon in which the first part 51 side is lifted up and the first part 51 is separated from the first bonding material 515, i.e., the so-called Manhattan phenomenon occurs, and insufficient bonding of the metal connector 5A and the semiconductor chip 14 occurs.

Furthermore, in the metal connector 5A of the semiconductor device 1, the third part 53 in the side connected to the metal frame 30 has a larger width than the width of the first part 51 in the Y-axis direction, and the weight of the third part 53 is larger than the weight of the first part 51. Therefore, the gravity center position of the metal connector 5A is shifted to the third part 53 side. Therefore, the first part 51 side is more easily lifted up by drawing of the third part 53 side caused by the above described surface tension, and the insufficient bonding of the metal connector 5A and the semiconductor chip 14 illustrated in FIG. 6 which is not provided with the notches 542 more easily occurs.

Therefore, when the notches 542 are not formed like the metal connector 5A, the semiconductor device 1, which has undergone the cooling and solidification of the melted first bonding material 515 and the second bonding material 301*d*, may have insufficient bonding of the semiconductor chip 14 and the metal connector 5A illustrated in FIG. 6 due to the Manhattan phenomenon.

Since the metal connector 5 of the semiconductor device 1 of the present embodiment illustrated in FIG. 1 to FIG. 3 is provided with, for example, the plurality of notches 542, which are formed to open from the second-end-side surfaces 53*b* of the third part 53 toward the first part 51 and penetrate through the metal connector 5 in the thickness direction (Z-axis direction), the semiconductor device 1 after the reflow process can be prevented from having the insufficient bonding of the semiconductor chip 14 and the metal connector 5 caused by the Manhattan phenomenon.

More specifically, since the metal connector 5 of the semiconductor device of the present embodiment is provided with, for example, the two notches 542, the three second-end-side surfaces 53*b*, which are non-continuous in the Y-axis direction, are provided. It is assumed that, in the reflow process, the melted and liquidized second bonding material 301*d* flows around each of the three second-end-side surfaces 53*b* of the metal connector 5 from the disposition surface 301*a*. In the non-continuous gaps between the second-end-side surfaces 53*c* of the third part 53 and the tilted surface 305*a* of the metal frame 30 in the Y-axis direction, the liquidized second bonding material 301*d* is not continuously integrated in the Y-axis direction. Therefore, the surface tension which draws the metal connector 5 obliquely downward toward the tilted surface 305*a* side does not occur almost at all.

Moreover, since the notches 542 are formed in the metal connector 5, the state in which the position of the gravity center of the metal connector 5 is closer to the first part 51 side (for example, the state in which it is closer by 50 μm) compared with the case of the metal connector 5A illustrated in FIG. 6 can be obtained. Herein, in the metal connector 5 of the semiconductor device 1 of the present embodiment, since the weight of the third part 53 is larger than the weight of the first part 51, lift-up of the first part 51 side can be restricted by shifting the position of the gravity center of the metal connector 5 to the first part 51 side by the presence of the notches 542.

The semiconductor device 1 illustrated in FIG. 1 to FIG. 3 after the cooling and solidification of the melted first bonding material 515 and the second bonding material 301*d* has been carried out, in which lift-up of the first part 51 side is restricted in the above described manner, can achieve the state in which insufficient bonding of the metal connector 5 and the semiconductor chip 14 does not occur as illustrated in FIG. 2.

After the reflow process is completed, the sealing material 19 is formed. The sealing material 19 is formed so as to seal a bonding portion between the first lead frame 10 and the semiconductor chip 14, a bonding portion between the first electrode 141 and the metal connector 5, a bonding portion between the metal connector 5 and the metal frame 30, a bonding portion between the second electrode 142 and the source connector 40, and a bonding portion between the source connector 40 and the second lead frame 12.

As described above, the semiconductor device 1 of the present embodiment can be prevented from having the insufficient bonding caused by the Manhattan phenomenon since: the metal frame 30 is provided with the disposition surface 301*a* on which the second bonding material 301*d* is disposed, and the tilted surface 305*a*, which is adjacent to the disposition surface 301*a* and tilted by the predetermined angle with respect to the disposition surface 301*a*; and the metal connector 5 is provided with the first part 51 connected to the first bonding material 515 and serving as the first end, the second part 52 integrally connected to the first part 51 and formed so as to rise toward the metal frame 30, the third part 53 integrally connected to the second part 52 and serving as the second end, the connecting surface 53*a* formed on the third part 53 and connected to the second bonding material 301*d*, the second-end-side surfaces 53*b* formed on the third part 53, adjacent to the connecting surface 53*a*, and opposed to the tilted surface 305*a* of the metal frame 30, and the notches 542 opening on the second-end-side surfaces 53*b* and penetrating through the third part 53 in the thickness direction thereof.

In the semiconductor device 1 of the present embodiment, in the direction (X-axis direction) in which the tilted surface 305*a* of the metal frame 30 and the second-end-side surface 53*b* of the metal connector 5 are opposed to each other, the length L1 of the notches 542 of the metal connector 5 is longer than the distance L2 (maximum distance L2) between the tilted surface 305*a* of the metal frame 30 and the second-end-side surface 53*b* of the metal connector 5. Therefore, in the reflow process, the second bonding material 301*d* enters the notches 542 and prevents the second bonding material 301*d*, which has flowed around the gaps between the second-end-side surfaces 53*b* of the metal connector 5 and the tilted surface 305*a* of the metal frame 30, and the entered second bonding material 301*d* from being integrated with each other. Therefore, occurrence of the surface tension which draws the metal connector 5 obliquely downward toward the tilted surface 305*a* side can be more reliably restricted.

In the semiconductor device 1 of the present embodiment, as illustrated in FIG. 1 to FIG. 3, the notches 542 of the metal connector 5 are formed to be rectangular when the metal connector 5 is viewed in the planar view. Also in the case in which the notches of the metal connector 5 are the notches 543 which are semicircular in the planar view illustrated in FIG. 4 or in the case in which the notches 544 are V-shaped in the planar view illustrated in FIG. 5, occurrence of the insufficient bonding caused by the Manhattan phenomenon can be also restricted as well as the above described case. For example, the shapes and sizes of the notches of the metal connector 5 may be arbitrarily selected in order to shift the position of the gravity center of the metal connector 5 toward the first part 51 side by a predetermined distance and set the gravity center at an optimum position.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor chip having an electrode;
a first bonding material provided on the electrode of the semiconductor chip;
a metal frame disposed to be separated from the semiconductor chip;
a second bonding material provided on the metal frame; and
a metal connector connected to the semiconductor chip via the first bonding material and connected to the metal frame via the second bonding material, wherein
the metal frame comprises:
a disposition surface on which the second bonding material is disposed; and
a tilted surface adjacent to the disposition surface and tilted by a predetermined angle with respect to the disposition surface,
the metal connector comprises:
a first part connected to the first bonding material and serving as a first end;
a second part integrally connected to the first part and formed so as to rise toward the metal frame;
a third part integrally connected to the second part and serving as a second end;
a connecting surface formed in the third part and connected to the second bonding material;
a second-end-side surface formed on the third part, adjacent to the connecting surface, and opposed to the tilted surface of the metal frame; and
a notch that opens on the second-end-side surface and penetrates through the third part in a thickness direction,
a direction orthogonal to a direction in which the tilted surface of the metal frame and the second-end-side surface of the metal connector are opposed to each other and to the thickness direction is a width direction of the metal connector, and
the metal connector is set such that a length of the third part in the width direction is longer than a length of the first part in the width direction, and a weight of the third part is larger than a weight of the first part.

2. The semiconductor device according to claim 1, wherein, in the direction in which the tilted surface of the metal frame and the second-end-side surface of the metal connector are opposed to each other, a length of the notch of the metal connector is longer than a distance between the tilted surface of the metal frame and the second-end-side surface of the metal connector.

3. The semiconductor device according to claim 1, wherein the electrode is a gate electrode, and the metal connector is a gate connector.

4. The semiconductor device according to claim 1, wherein the notch is rectangular, semicircular, or V-shaped in the metal connector in a planar view.

5. A semiconductor device comprising:
a semiconductor chip having an electrode;
a first bonding material provided on the electrode of the semiconductor chip;
a metal frame disposed to be separated from the semiconductor chip;

a second bonding material provided on the metal frame; and a metal connector connected to the semiconductor chip via the first bonding material and connected to the metal frame via the second bonding material, wherein the metal frame comprises:

a disposition surface on which the second bonding material is disposed; and a tilted surface adjacent to the disposition surface and tilted by a predetermined angle with respect to the disposition surface, the metal connector comprises:

a first part connected to the first bonding material and serving as a first end;

a second part integrally connected to the first part and formed so as to rise toward the metal frame;

a third part integrally connected to the second part and serving as a second end;

a connecting surface formed in the third part and connected to the second bonding material; a second-end-side surface formed on the third part, adjacent to the connecting surface, and opposed to the tilted surface of the metal frame; and a notch that opens on the second-end-side surface and penetrates through the third part in a thickness direction, and in a direction in which the tilted surface of the metal frame and the second-end-side surface of the metal connector are opposed to each other, a length of the notch of the metal connector is longer than a distance between the tilted surface of the metal frame and the second-end-side surface of the metal connector.

\* \* \* \* \*